(12) United States Patent
Tanaka

(10) Patent No.: US 6,302,313 B1
(45) Date of Patent: Oct. 16, 2001

(54) FLIP-CHIP BONDING METHOD AND APPARATUS

(75) Inventor: Yuji Tanaka, Kokubunji (JP)

(73) Assignee: Kabushiki Kaisha Shinkawa, Tokyo (JP)

(*) Notice: Subject to any disclaimer, the term of this patent is extended or adjusted under 35 U.S.C. 154(b) by 0 days.

(21) Appl. No.: 09/253,450

(22) Filed: Feb. 19, 1999

(30) Foreign Application Priority Data

Feb. 20, 1998 (JP) .................................... 10-056016

(51) Int. Cl.⁷ ..................... B23K 5/00; B23K 37/04; B23Q 15/00
(52) U.S. Cl. ..................... 228/102; 228/8; 228/49.1; 228/49.5; 228/105
(58) Field of Search ..................... 228/102, 105, 228/8, 49.1, 49.5

(56) References Cited

U.S. PATENT DOCUMENTS

| | | | |
|---|---|---|---|
| 3,641,648 | * 2/1972 | Kalberman | 29/203 B |
| 4,671,446 | * 6/1987 | Sherman | 228/4.5 |
| 5,022,580 | * 6/1991 | Pedder | 228/56.3 |
| 5,068,713 | * 11/1991 | Toda | 357/72 |
| 5,536,974 | * 7/1996 | Nishiguchi | 257/778 |
| 5,650,640 | * 7/1997 | Stafford et al. | 257/81 |
| 5,745,238 | * 4/1998 | Long et al. | 356/376 |
| 5,868,560 | * 2/1999 | Tamada et al. | 430/5 |
| 5,908,585 | * 6/1999 | Shibuta | 252/506 |
| 5,932,395 | * 8/1999 | Okamoto et al. | 430/311 |

FOREIGN PATENT DOCUMENTS

H5-29546   2/1993 (JP) .
H6-28272   4/1994 (JP) .

* cited by examiner

Primary Examiner—Patrick Ryan
Assistant Examiner—Zidia T. Pittman
(74) Attorney, Agent, or Firm—Koda & Androlia (57) ABSTRACT

So as to confirm bonding precision for assuring accurate bonding, a precision confirmation substrate composed of a transparent sheet member and a precision confirmation chip composed of a transparent sheet member are used; and a precision confirmation substrate positioning component for positioning and fixing the precision confirmation substrate is provided on a bonding station, the precision confirmation chip is held by suction to a tool and disposed above the precision confirmation substrate, images of the precision confirmation substrate and precision confirmation chip are detected by an optical probe, the precision confirmation substrate and precision confirmation chip are moved and positioned relative to each other, the precision confirmation chip is then placed on the precision confirmation substrate, and the superimposed precision confirmation substrate and precision confirmation chip are again detected by the optical probe.

2 Claims, 11 Drawing Sheets

FLIP-CHIP BONDING METHOD AND APPARATUS

BACKGROUND OF THE INVENTION

1. Field of the Invention

The present invention relates to a flip-chip bonding method and apparatus.

2. Prior Art

A semiconductor device with a daisy-chain type of pattern, for example, is produced by directly bonding a chip to a substrate and then injecting a sealant composed of a resin or the like between the chip and substrate. On the substrate side, a pattern and pads are formed on a printed substrate or ceramic substrate; and on the chip side, pads are formed on a silicon chip. Since the substrate and chip are opaque, the pattern and pads of the substrate and chip cannot be observed by optical transmission.

A daisy-chain type of pattern is known from Japanese Patent Application Laid-Open (Kokai) H5-29546, for example, and with this type of pattern, if the pad groups provided on the substrate and the pad groups provided on the chip are superimposed in the bonding of the substrate and chip, then electrical conduction will be achieved between each pad of the substrate and the corresponding pad of the chip, thus forming a single electrical path between two electrical conduction confirmation terminals provided to the substrate.

Figure 14:
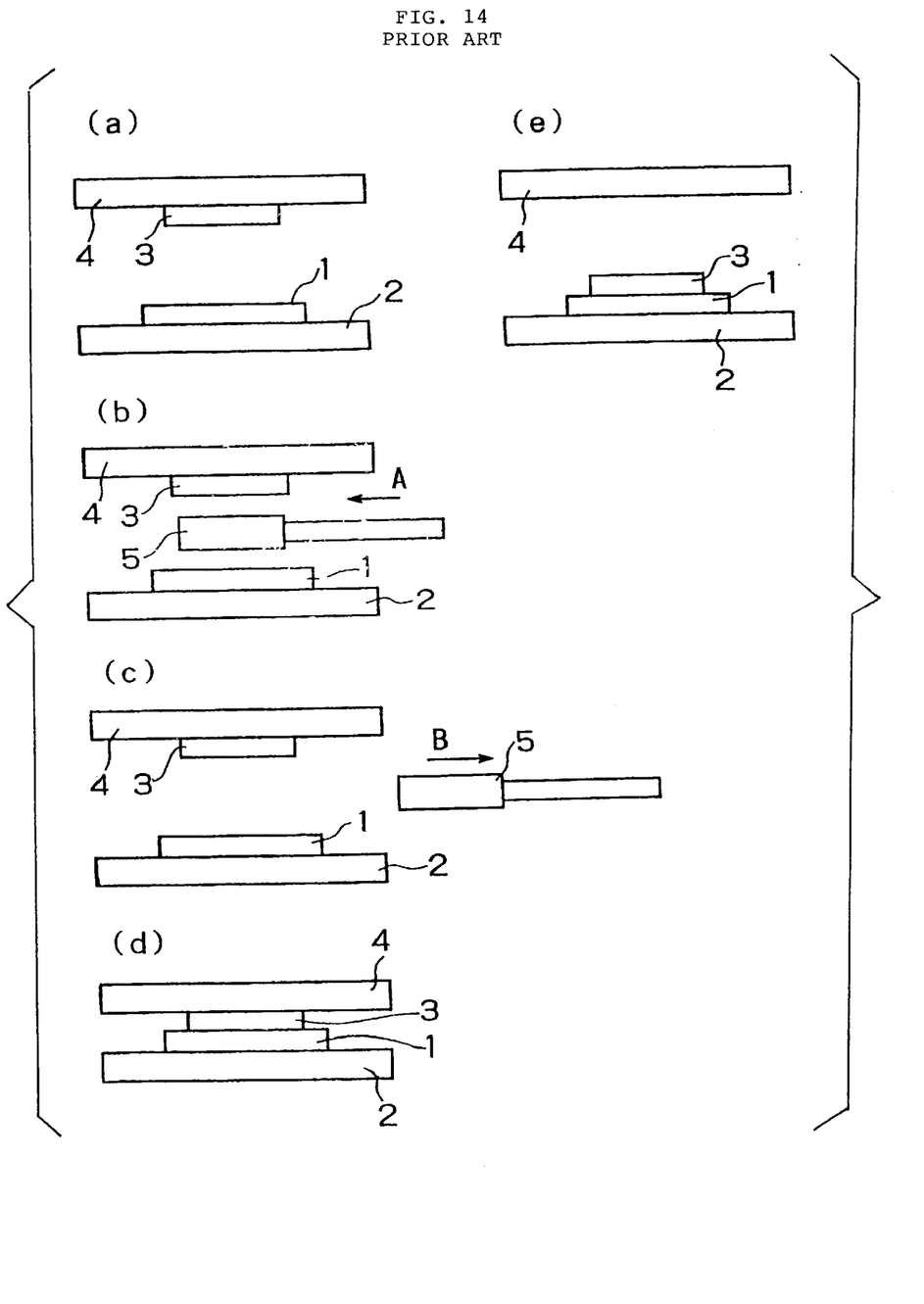
FIG. 14 is a diagram illustrating the steps of a conventional flip-chip bonding method.

The bonding of a semiconductor device with a daisy-chain pattern is carried out by the steps illustrated in FIG. 14.

As shown in FIG. 14(a), a substrate 1 is set so that its pattern and pads face up, the substrate 1 being supported on a substrate chuck 2; a chip 3 is set so that its pattern and pads are facing down, the chip 3 being supported by a chip chuck 4; and further the chip 3 is disposed above the substrate 1.

Next, as shown in FIG. 14(b), an optical probe 5 having upper and lower detection components on its top and bottom surfaces, respectively, is inserted in the direction of arrow A between the substrate 1 and the chip 3, and the respective patterns and pads of the substrate 1 and chip 3 are detected by an optical probe 5. The substrate chuck 2 and the chip chuck 4 are moved in relation to each other so as to level and position the substrate 1 and the chip 3.

After this, as shown in FIG. 14(c), the optical probe 5 is moved in the direction of arrow B, after which the chip chuck 4 is lowered and the substrate 1 is bonded with the chip 3 as shown in FIG. 14(d). Then, as shown in FIG. 14(e), the substrate chuck 2 is lowered to complete the bonding. Examples of this optical probe 5 are disclosed in Japanese Patent Application Publication (Kokoku) H6-28272, for instance.

Confirmation of the bonding precision of a semiconductor device such as this can be accomplished by two methods. In the first method, a substrate 1 and a chip 3 that are actual products are bonded and checked under an infrared microscope after bonding, or they are checked by tearing off the chip 3 in a destructive test. Here, observing the components under an infrared microscope is based on the fact that the chip 3 is composed of silicon and infrared rays pass through silicon, so a transmission image of the chip 3 is obtained. In the second method, the substrate or the chip is bonded to a precision confirmation element composed of transparent glass, this bonded product is taken out of the bonding apparatus, and then the positional shift of the pattern and pads is measured from the glass side with a length measuring machine.

Thus, since either a bonded actual product or a precision confirmation element has to be taken out of the bonding apparatus for measurement, the bonding precision cannot be confirmed rapidly. If there is any positional shift, the mechanism of the optical probe 5 or the drive components of the substrate chuck 2 and chip chuck 4 are adjusted. Of these adjustments, the adjustment of the mechanism of the optical probe 5, for instance, is performed because, as disclosed in Japanese Patent Application Publication (Kokoku) H6-28272, the images detected by upper and lower detection components are each captured by an imaging element via separate optical systems; and since there are thus two optical systems, positional discrepancy occurs if the two systems are not aligned; as a result, the optical systems need to be adjusted.

Also, since there is no daisy-chain pattern with a conventional precision confirmation element that is transparent on just one side, the bonded precision confirmation semiconductor device is opaque, and electrical conduction cannot be confirmed. Accordingly, an actual semiconductor device, which is an opaque finished product, needs to be inspected in order to confirm electrical conduction, and the confirmation of bonding precision and the confirmation of electrical conduction have to be carried out separately. Also, because it is opaque, the interior of the bonded component cannot be checked, and it is impossible to observe the injection state after a sealant is injected between the substrate and the chip in a subsequent step.

SUMMARY OF THE INVENTION

Accordingly, the first object of the present invention is to provide a flip-chip bonding method and apparatus with which bonding precision can be confirmed in the bonding apparatus and bonding can be carried out with a good precision being ensured.

The second object of the present invention is to provide a flip-chip bonding method and apparatus with which bonding precision and electrical conduction can both be confirmed.

The first object of the present invention is accomplished by a unique flip-chip bonding method in which a chip held by suction to a tool is disposed over a substrate positioned at a bonding station, an optical probe having upper and lower detection components is inserted between the substrate and the chip so as to detect an image of the substrate and an image of the chip, the substrate and the chip are moved and positioned relative to each other, the optical probe is retracted from between the substrate and the chip, and the chip is then bonded to the substrate, and in the present invention: a precision confirmation substrate composed of a transparent sheet member and a precision confirmation chip composed of a transparent sheet member are used; and the precision confirmation substrate is positioned and fixed at the bonding station, the precision confirmation chip is held by suction to a tool and disposed over the precision confirmation substrate, the optical probe is inserted between the precision confirmation substrate and the precision confirmation chip so as to detect an image of the precision confirmation substrate and an image of the precision confirmation chip, the precision confirmation substrate and the precision confirmation chip are moved and positioned relative to each other, the optical probe is retracted from between the precision confirmation substrate and the precision confirmation chip, the precision confirmation chip is then placed on the precision confirmation substrate, and the superimposed precision confirmation substrate and precision confirmation chip are detected by the optical probe, thereby confirming the precision of bonding position of a flip-chip bonding apparatus.

In addition, the first object of the present invention is accomplished by a unique flip-chip bonding apparatus in which a chip held by suction to a tool is disposed over a substrate positioned at a bonding station, an optical probe having upper and lower detection-components is inserted between the substrate and the chip to detect an image of the substrate and an image of the chip, the substrate and the chip are moved and positioned relative to each other, the optical probe is retracted from between the substrate and the chip, and the chip is then bonded to the substrate; and in the present invention: a precision confirmation substrate composed of a transparent sheet member and a precision confirmation chip composed of a transparent sheet member are used; and a precision confirmation position is provided at which the precision confirmation substrate is positioned and fixed at the bonding station, a precision confirmation chip placement site is provided at which the precision confirmation chip is placed on the bonding station on a table to which the bonding station is attached, the precision confirmation chip is held by suction to a tool and disposed over the precision confirmation substrate, the optical probe is inserted between the precision confirmation substrate and the precision confirmation chip so as to detect an image of the precision confirmation substrate and an image of the precision confirmation chip; the precision confirmation substrate and the precision confirmation chip are moved and positioned relative to each other, the optical probe is retracted from between the precision confirmation substrate and the precision confirmation chip, the precision confirmation chip is then placed on the precision confirmation substrate, and the superimposed precision confirmation substrate and precision confirmation chip are detected by the optical probe, thereby confirming the precision of bonding position of the flip-chip bonding apparatus.

In the flip-chip bonding method of the present invention, the tool comprises a precision confirmation tool and a bonding tool; and during precision confirmation, the precision confirmation tool is held by suction to a tool mounting component provided on a bonding head, and during the bonding operation the bonding tool is held by suction to the tool mounting component.

In the flip-chip bonding apparatus of the present invention, the tool comprises a precision confirmation tool and a bonding tool, and the precision confirmation tool and the bonding tool are disposed at the bonding station or the table; and during precision confirmation the precision confirmation tool is held by suction to a tool mounting component provided on a bonding head, and during bonding operation the bonding tool is held by suction to the tool mounting component.

Further, in the flip-chip bonding method and apparatus of the present invention, the precision confirmation substrate and precision confirmation chip are each provided with bonding alignment confirmation measurement graduations at corresponding positions.

Furthermore, the bonding alignment confirmation measurement graduations comprise X-axis measurement graduations and Y-axis measurement graduations which are located on perpendicular axes.

In addition, the spacing between the X-axis measurement graduations and Y-axis measurement graduations for the precision confirmation chip are either smaller or larger than the spacing between the X-axis measurement graduations and Y-axis measurement graduations for the precision confirmation substrate, and the X-axis graduation reference line and the Y-axis graduation reference line of the precision confirmation chip are formed so as to match up with the X-axis graduation reference line and Y-axis graduation reference line of the precision confirmation substrate.

Furthermore, the precision confirmation chip and the precision confirmation substrate are used to perform flip-chip bonding; and the bonding precision and bonding state of the precision confirmation bonding elements as well as the electrical conduction are confirmed.

BRIEF DESCRIPTION OF THE DRAWINGS

FIG. 1 is a schematic diagram of an embodiment of the flip-chip bonding apparatus of the present invention, wherein FIG. 1(*a*) is a front view and FIG. 1(*b*) a top view of the XY table portion;

FIG. 2 illustrates the bonding station, wherein

FIG. 2(*a*) is a top view and

FIG. 2(*b*) a view taken along the line 2*b*—2*b*;

FIG. 3 is a detailed view of the precision confirmation position, wherein

FIG. 3(*a*) is a top view and

FIG. 3(*b*) is a front view;

FIG. 6 illustrates a tool, wherein

FIG. 6(*a*) is a perspective view from above and

FIG. 6(*b*) is a perspective view from the rear;

DETAILED DESCRIPTION OF THE PREFERRED EMBODIMENTS

Embodiments of the present invention will be described with reference to FIGS. 1 and 13.

As shown in FIG. 1, a flip-chip bonding apparatus has an XY table 11 driven in the X and Y axial directions, and a bonding station 12 is fixed on this XY table 11. A bonding head 13 rotationally driven up and down by a drive means (not shown) is disposed above the bonding station 12, and a tool 30 is detachably attached to the bonding head 13 via a tool mounting component 20. An optical probe 14 having upper and lower detection components on its top and bottom surfaces, respectively, is provided between the bonding station 12 and the tool 30 so that it can move in and out.

The above is a known construction and will not be described in further detail.

In this embodiment, two substrate positioning components 40A and 40B and a precision confirmation substrate positioning component 50 are provided above the bonding station 12. Three tool stations 55 (55A, 55B and 55C) are provided on the XY table 11 so as to be located on the side of the bonding station 12. Chip placement sites 60 and a precision confirmation chip placement site 61 are provided in front of the bonding station 12 (near the operator).

The substrate positioning components 40A and 40B shown in FIG. 1(b) will be described with reference to FIG. 2.

Substrates 41A and 41B have two rows of bonding components 42A and 42B, respectively, and positioning holes 43A and 43B are provided at equidistant spacing on both sides. The substrate positioning components 40A and 40B are provided with numerous substrate suction holes 44A and 44B to be used for holding the substrates 41A and 41B by suction, and with positioning pieces 46A and 46B having positioning pins 45A and 45B that are inserted into the positioning holes 43A and 43B of the substrates 41A and 41B.

Figure 1A:
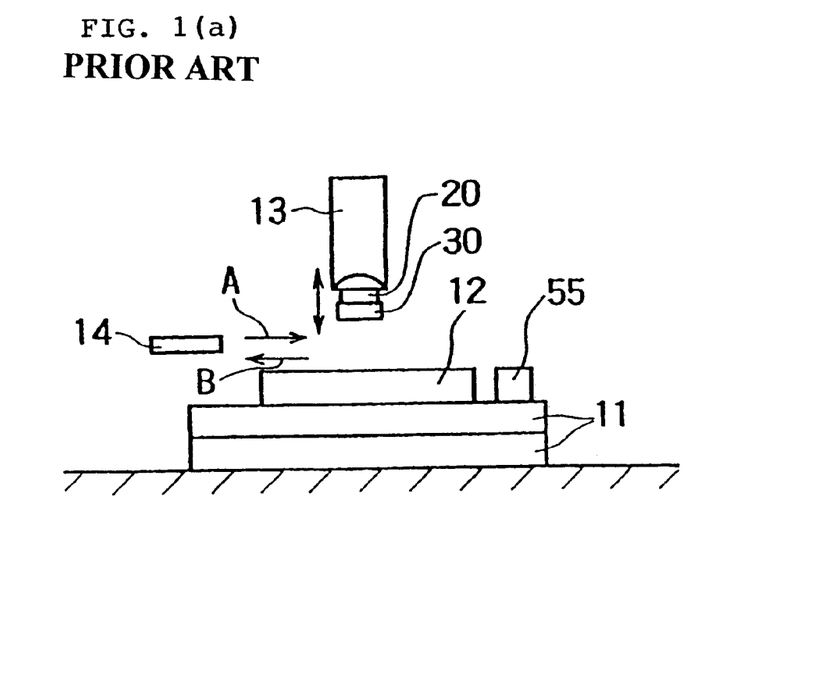
Figure 1B:
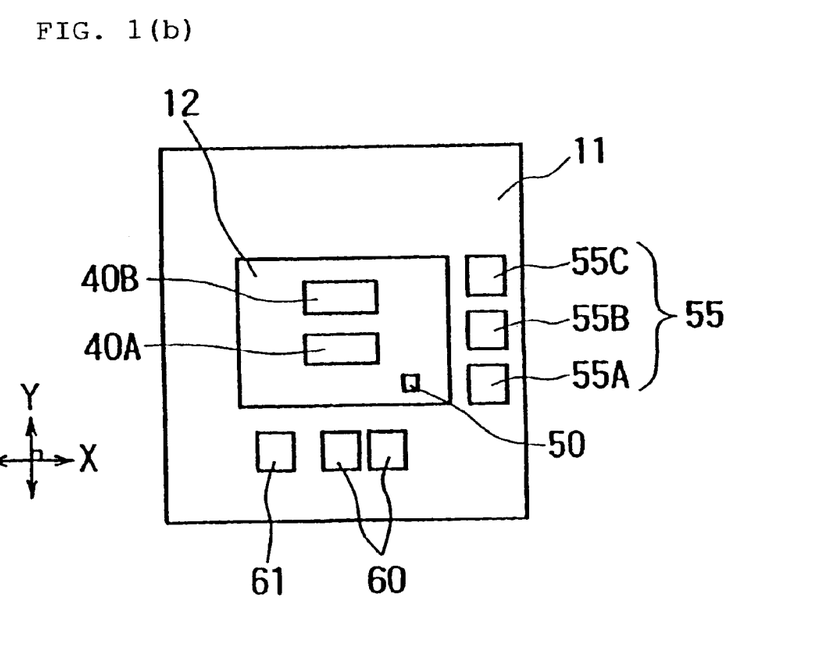
Figure 2A:
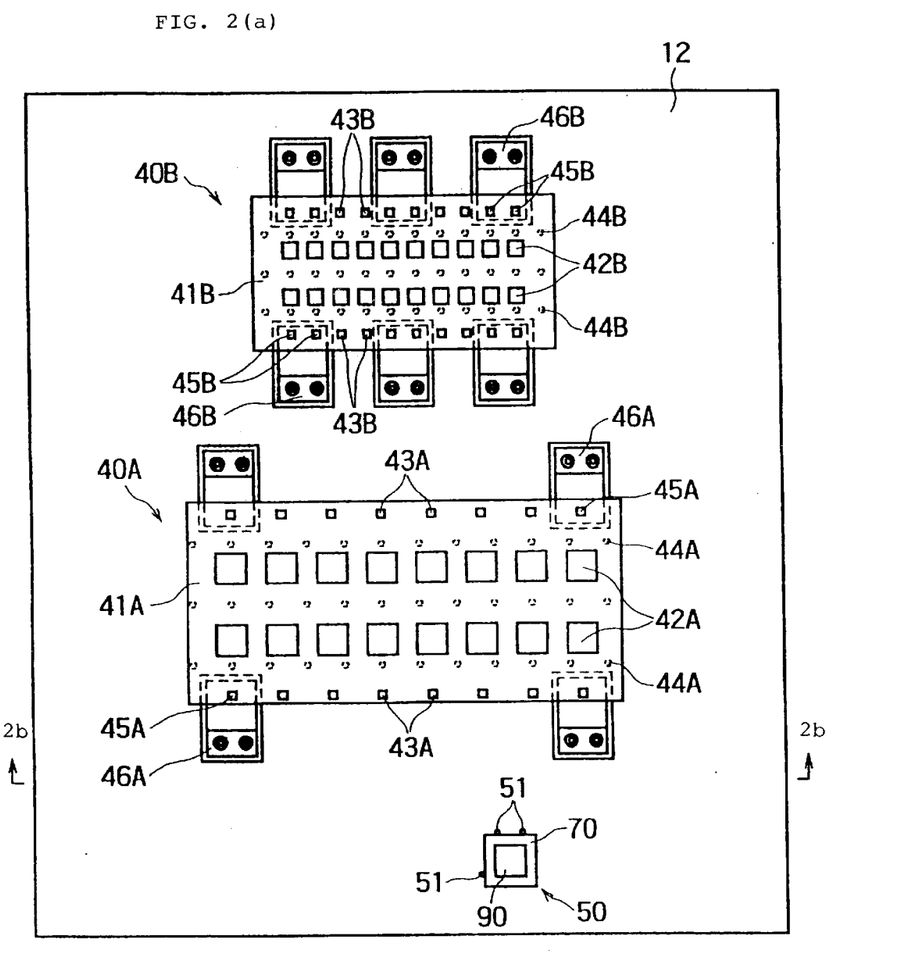
Figure 2B:
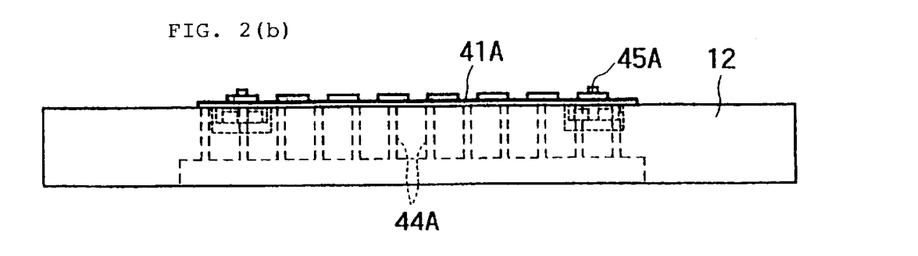
Figures 3A, 3B:
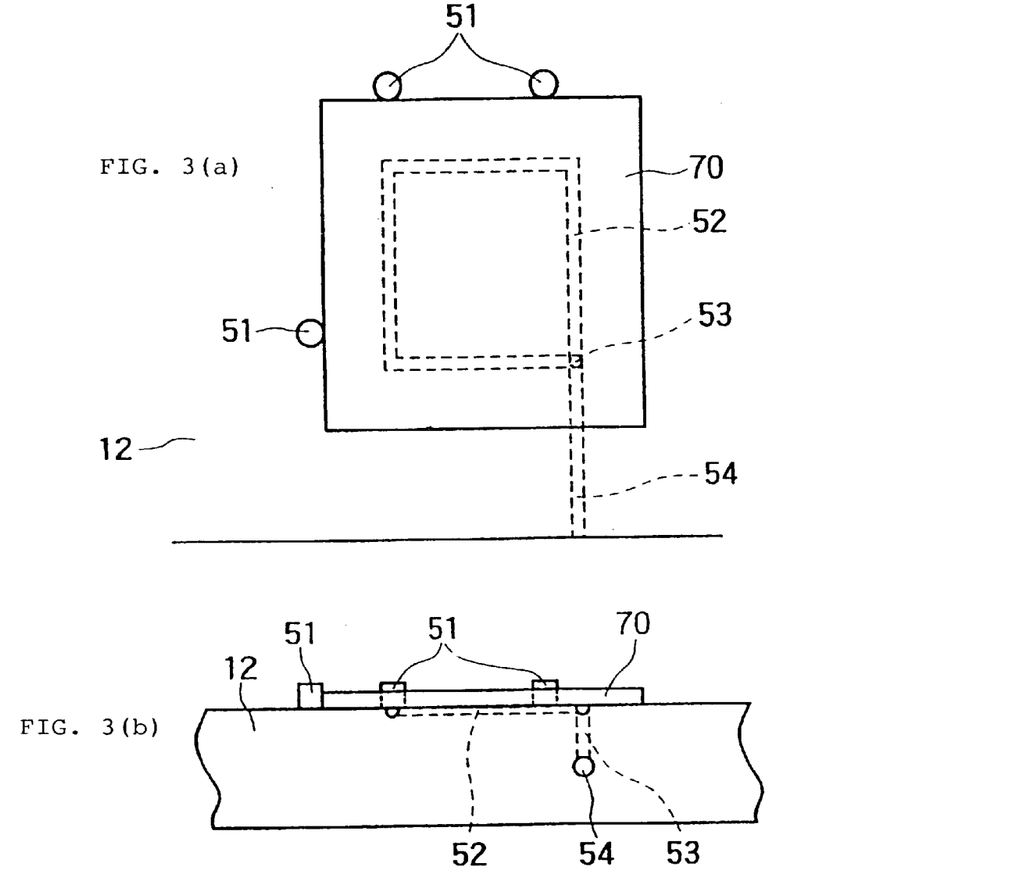
Figure 4:
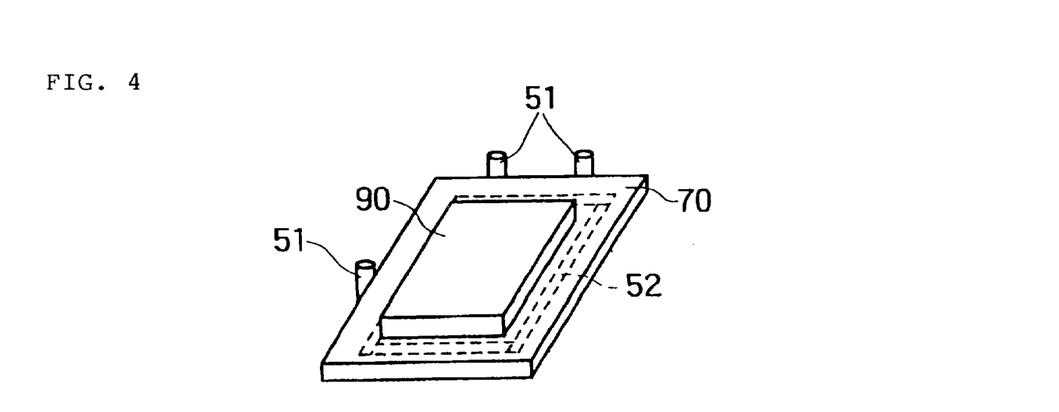
FIG. 4 is a perspective view of the state in which the precision confirmation chip has been placed on the precision confirmation substrate.

As shown in FIG. 2(a) and FIG. 3, the precision confirmation substrate positioning component 50 shown in FIG. 1(b) is provided with three positioning pins 51 that position a precision confirmation substrate 70, and also with a precision confirmation substrate suction groove 52 that holds the precision confirmation substrate 70 by suction. A vertical hole 53 is formed so as to pass through the precision confirmation substrate suction groove 52, a duct 54 is connected to the vertical hole 53, and the duct 54 is connected to a vacuum source (not shown).

Figure 5:
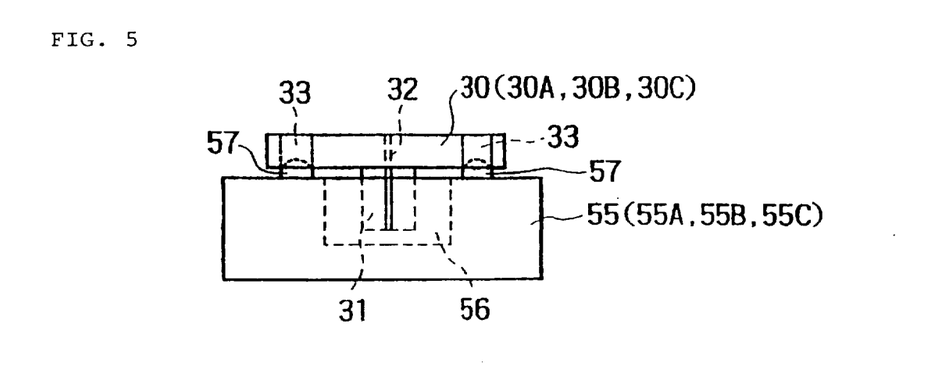
FIG. 5 is a front view of the tool at the tool station.
Figures 6A, 6B:
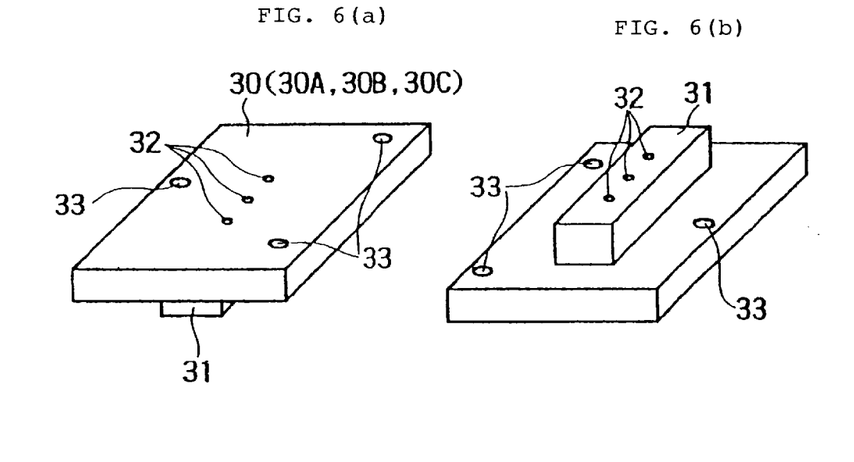
Figure 7:
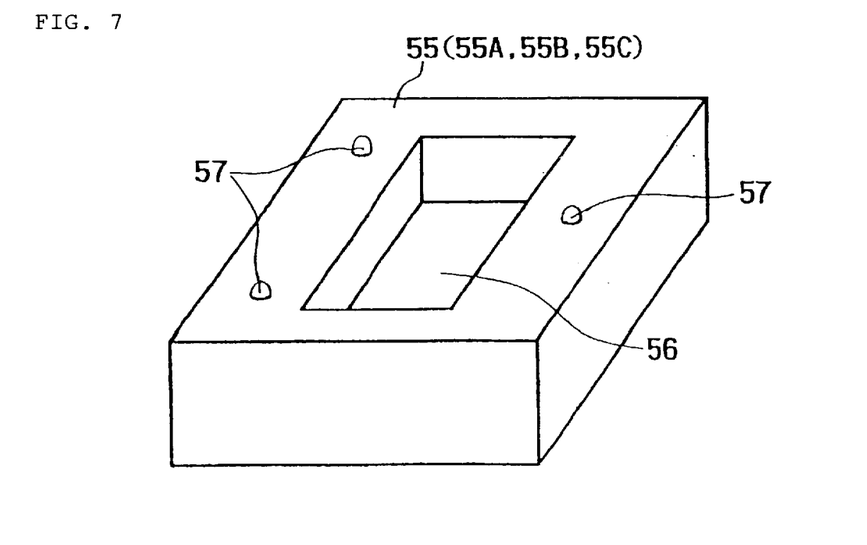
FIG. 7 is a perspective view of the tool station.

The structure of the tool 30 (30A, 30B and 30C) and the tool station 55 (55A, 55B and 55C) shown in FIG. 1 will be described with reference to FIGS. 5 to 7.

The tool 30 (30A, 30B and 30C) has a rectangular chip suction component 31 protruding below, and one or more chip suction holes 32 are provided to the chip suction component 31. Tool positioning holes 33 are further provided on the tool 30 (30A, 30B and 30C). The tool station 55 (55A, 55B and 55C) is provided with positioning pins 57 that engage with the tool positioning holes 33 and a chip suction component insertion hole 56 into which the chip suction component 31 of the tool 30 (30A, 30B and 30C) is inserted. The tool station 55A shown in FIG. 1 accommodates a tool 30A for a precision confirmation chip 90 (discussed below), and the tool stations 55B and 55C accommodate the tools 30B and 30C for a chip 62 (discussed below).

Figure 8:
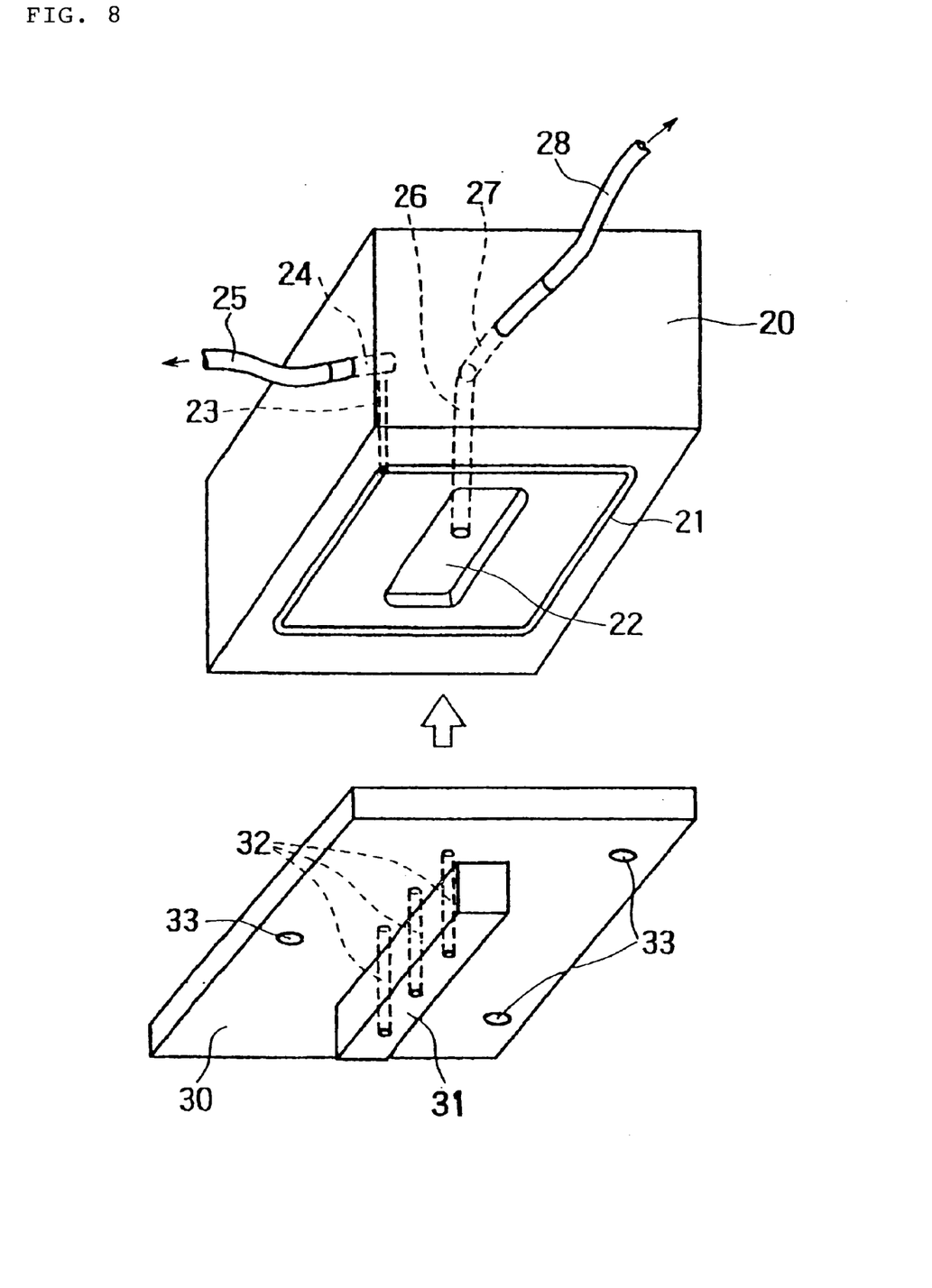
FIG. 8 is a perspective view of the relation between the tool mounting component and the tool, viewed from below.

As shown in FIG. 8, the tool mounting component 20 provided on the bonding head 13 shown in FIG. 1(a) has formed in it an annular tool suction groove 21 for holding the tool 30 (30A, 30B and 30C) by suction. A rectangular hole 22 is formed on the inside of the tool suction groove 21 so as to communicate with the chip suction holes 32 of the tool 30 (30A, 30B and 30C). The tool suction groove 21 communicates with a pipe 25 through a vertical hole 23 and a horizontal hole 24, and the pipe 25 is connected to a vacuum source (not shown). Likewise, the hole 22 communicates with a pipe 28 through a vertical hole 26 and a horizontal hole 27, and the pipe 28 is connected to a vacuum source (not shown).

Figure 9:
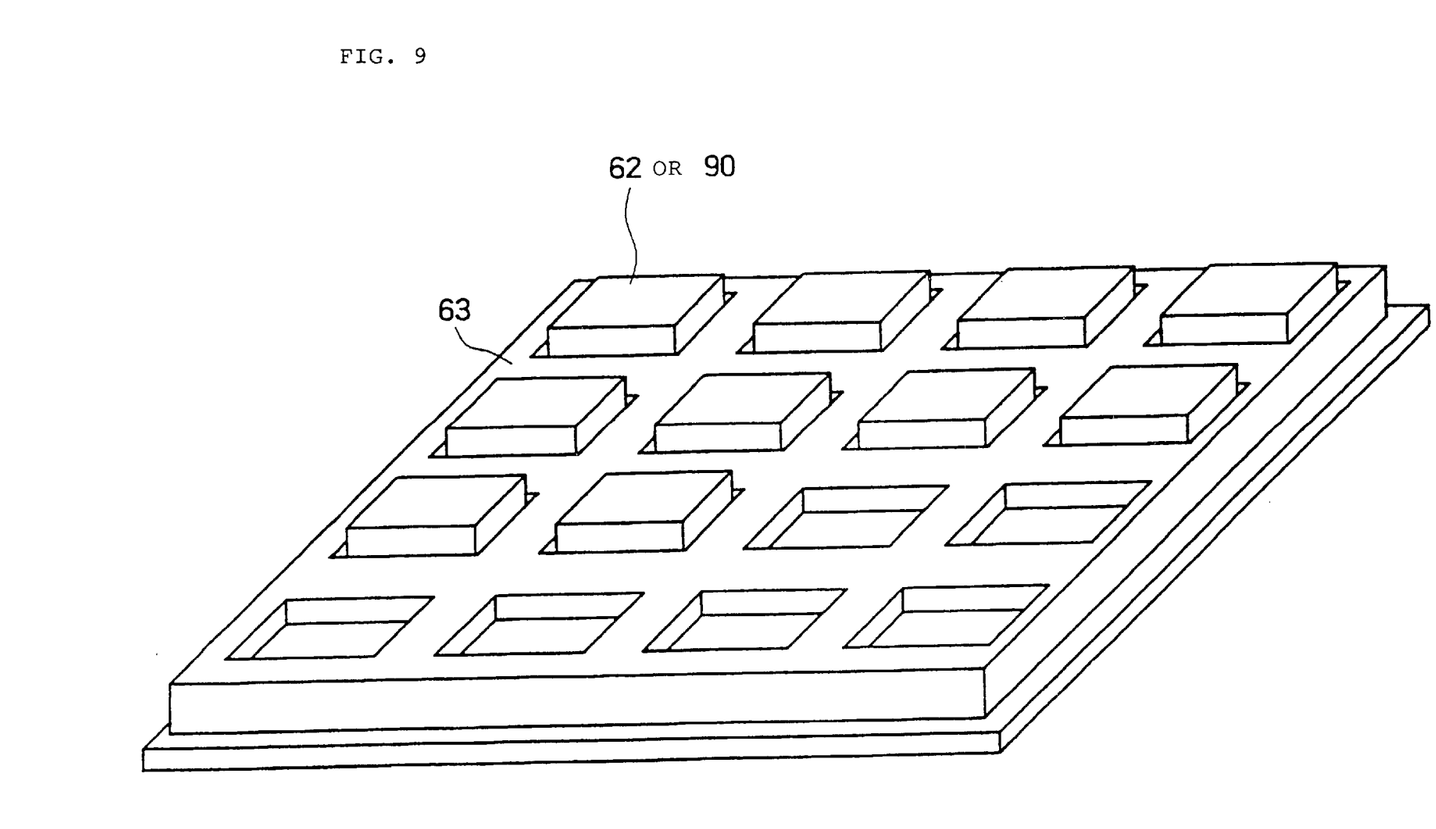
FIG. 9 is a perspective view of the chip tray and the precision confirmation chip tray.

Trays 63 that accommodate the chips 62 and the precision confirmation chips 90, as the case may be, as shown in FIG. 9, are placed in position at the chip placement sites 60 and the precision confirmation chip placement site 61 shown in FIG. 1(b).

Figure 10:
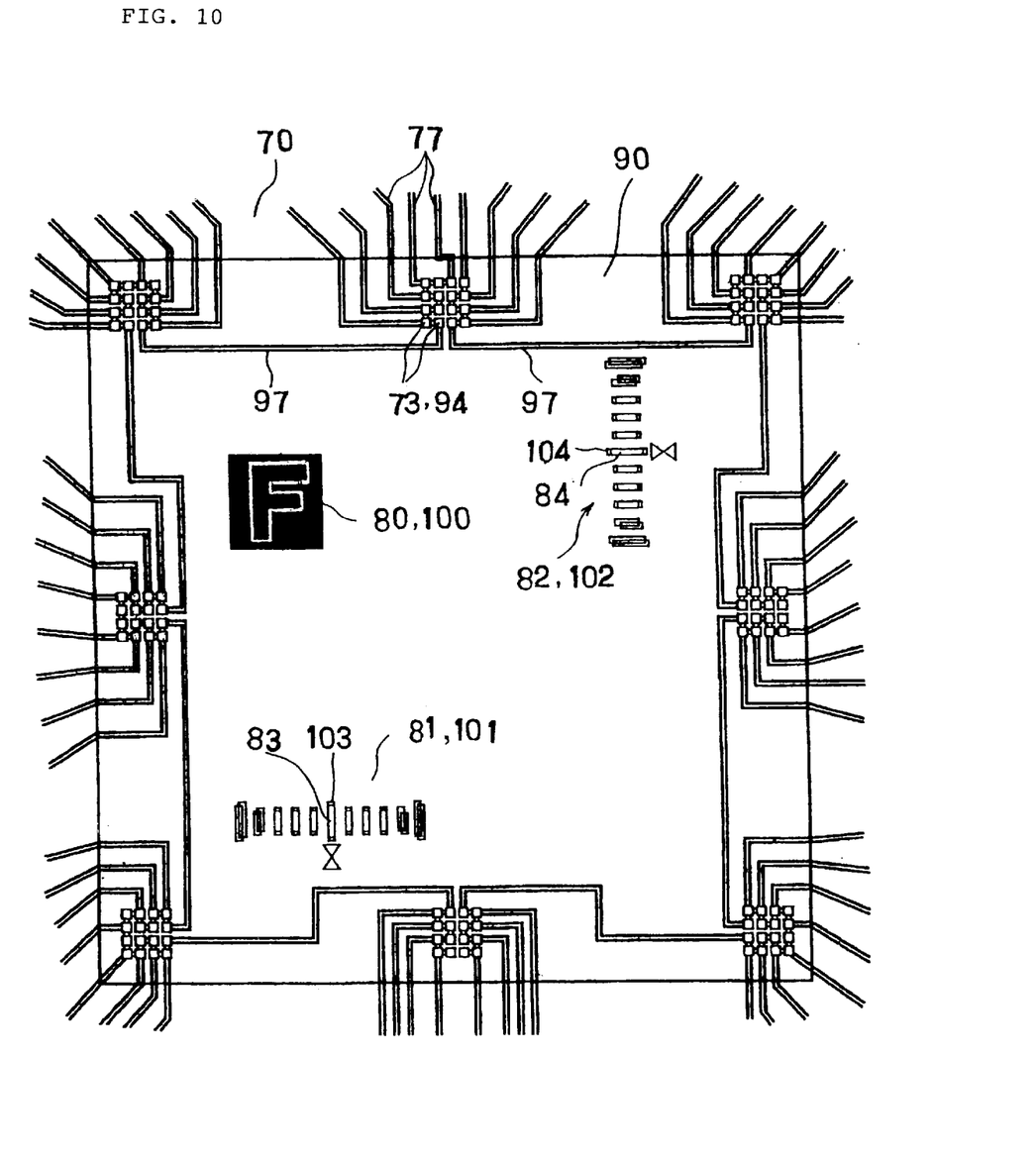
FIG. 10 is a perspective view of the precision confirmation chip placed on the precision confirmation substrate, viewed from above.
Figure 11:
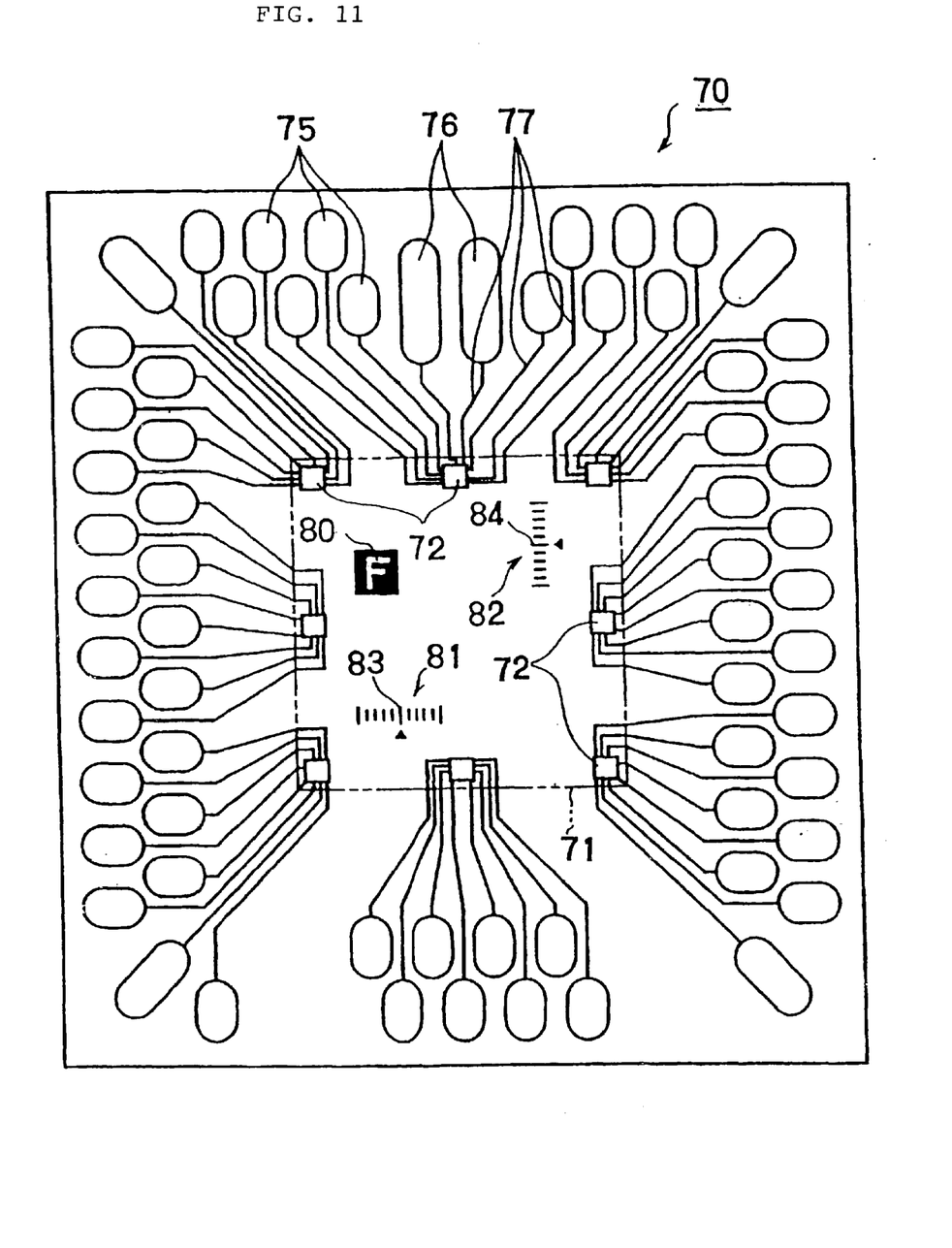
FIG. 11 is a top view of the entire precision confirmation substrate.
Figure 12:
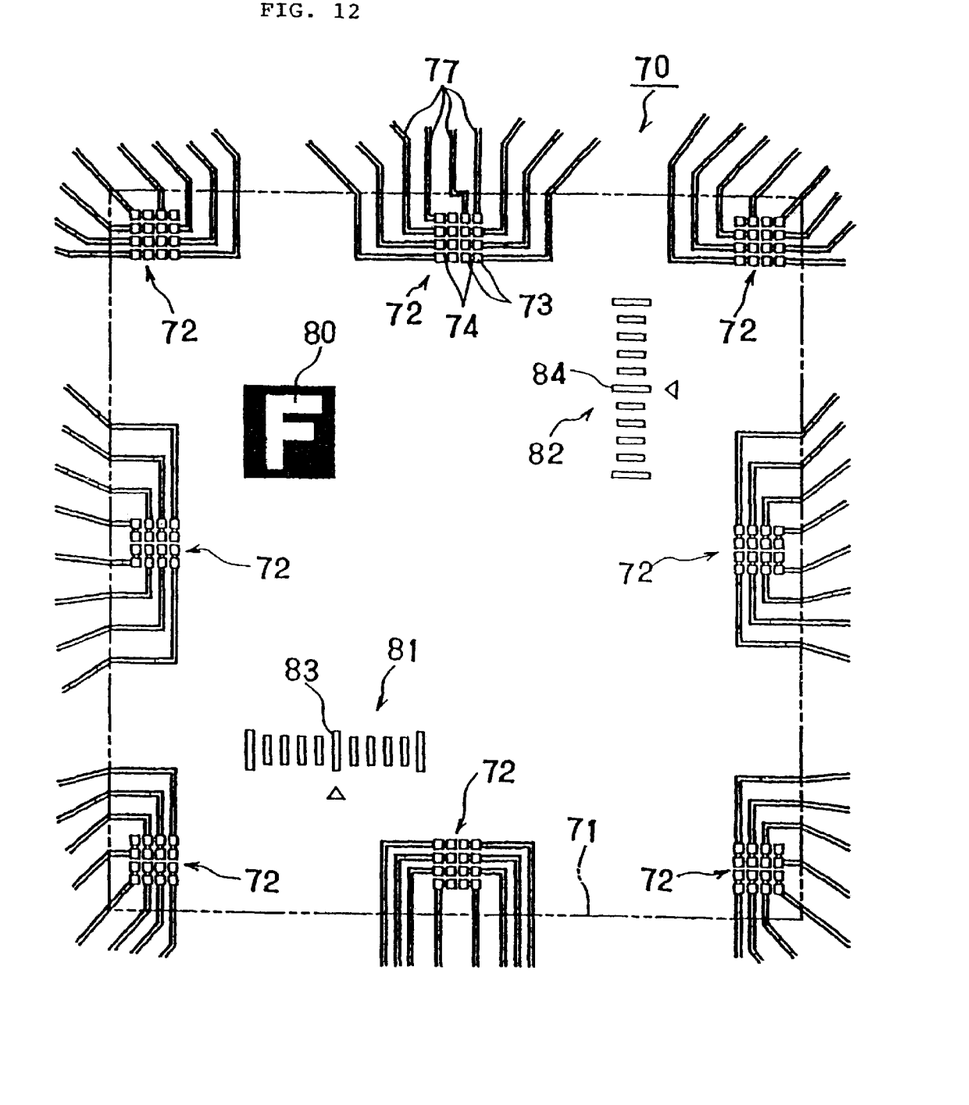
FIG. 12 is an enlarged detailed view thereof.

The precision confirmation substrate 70 and the precision confirmation chip 90 will be described with reference to FIGS. 10 to 13. FIG. 11 illustrates the precision confirmation substrate 70, FIG. 12 is an enlarged view of the chip bonding component of the precision confirmation substrate 70, and FIG. 13 illustrates the precision confirmation chip 90.

The precision confirmation substrate 70 and the precision confirmation chip 90 are each composed of transparent glass. The side on which pad groups and wiring are formed in a known daisy-chain style is facing up in FIGS. 11 and 12, and the side on which pad groups are formed in a known daisy-chain style is facing down in FIG. 13, thus the pad groups are being shown through the precision confirmation chip 90 from the top. The layout of the pad groups and the wiring between the pad groups shown in FIGS. 11 and 12, the shape and layout of the pad groups 92 shown in FIG. 13 and the wiring thereof, and the wiring 97 connecting the pads 92 are determined by the type of semiconductor device, and are not related to the gist of the present invention. Thus, they will be described only briefly below.

First, the pad groups of the precision confirmation substrate 70 and the wiring thereof will be described briefly with reference to FIGS. 11 and 12. Eight pad groups 72 are formed within the chip bonding frame 71, which shows the frame in which the precision confirmation chip 90 is bonded; and each of the pad groups 72 comprises 16 pads 73. Some of the adjacent pads 73 are connected to each other by connectors 74. A plurality of lead terminals 75 and two electrical conduction precision confirmation terminals 76 are formed around the outer periphery of the precision confirmation substrate 70. These lead terminals 75 and electrical conduction precision confirmation terminals 76 are connected to corresponding pads 73 of the pad groups 72 by wiring 77.

Next, the pad groups of the precision confirmation chip 90 and the wiring thereof will be described briefly with reference to FIG. 13. Eight pad groups 92 are formed at positions corresponding to the pad groups 72 of the precision confirmation substrate 70, and each of the pad groups 92 comprises 16 pads 93 of the same shape and arrangement as the pads 73 of the precision confirmation substrate 70. Some of the adjacent pads 93 are connected to each other by connectors 94. Some of the pads 93 in each pad group 92 are connected to pads 93 in other pad groups 92 by wiring 97.

The above-described connectors 74 of the precision confirmation substrate 70, the connectors 94 of the precision confirmation chip 90, and the wiring 97 have a daisy-chain pattern; and when the precision confirmation chip 90 is bonded to the precision confirmation substrate 70, there will be electrical conduction when the terminals of a conduction tester are brought into contact with the electrical conduction precision confirmation terminals 76 of the precision confirmation substrate 70.

The characteristic portions of the precision confirmation substrate 70 and the precision confirmation chip 90 will now be described. An outlined direction alignment marker 80 is formed within the chip bonding frame 71 of the precision confirmation substrate 70 shown in FIGS. 11 and 12. X-axis measurement graduations 81 for confirming the bonding alignment precision in the X axial direction out of the two perpendicular axes are provided within the chip bonding frame 71, and Y-axis measurement graduations 82 are similarly provided in the Y axial direction, which is the other of the two perpendicular axes. The lines indicated by triangles are an X-axis graduation reference line 83 and a Y-axis graduation reference line 84.

Figure 13:
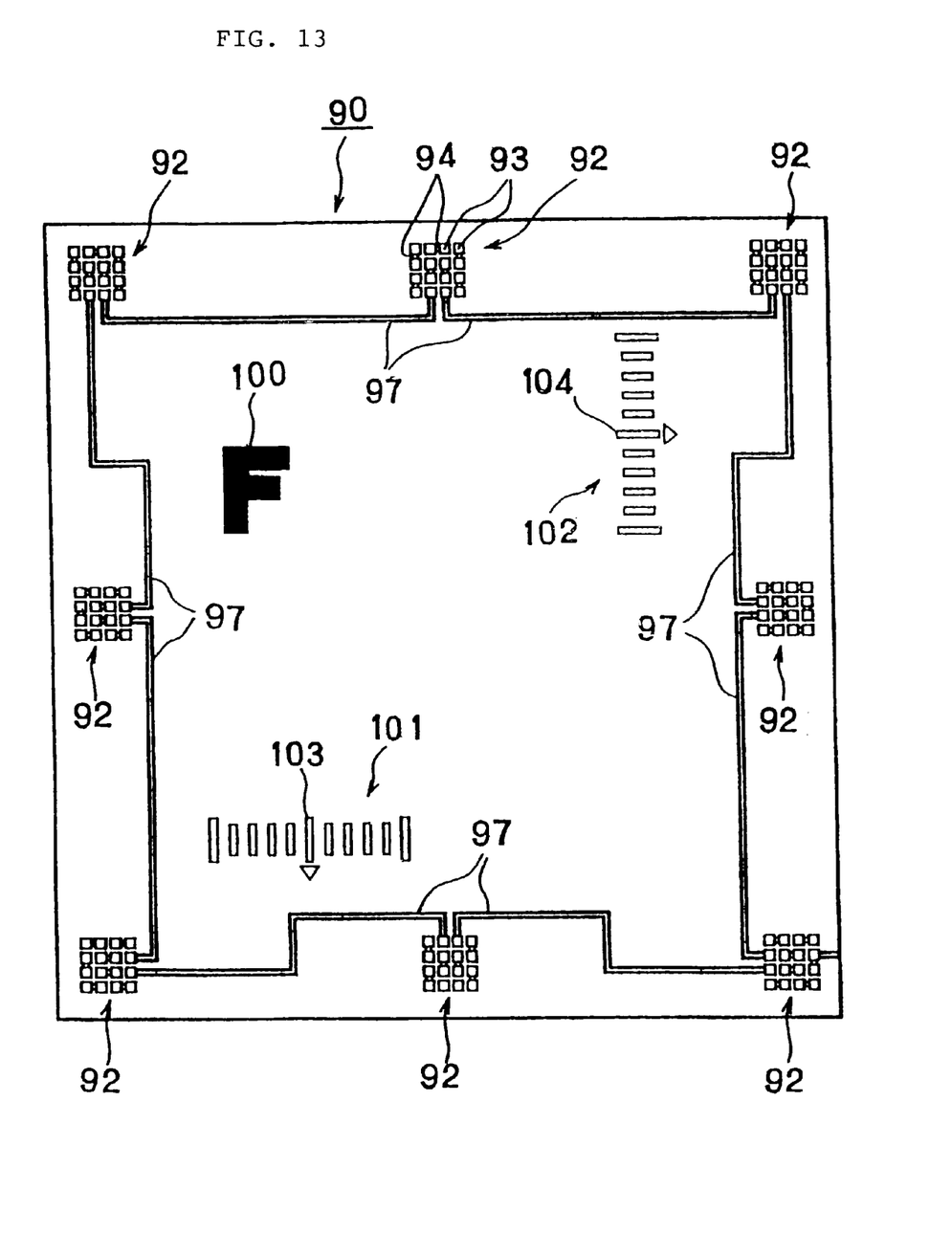
FIG. 13 is a top view of the precision confirmation chip, with the pattern formed on the lower side viewed from the upper side.

As shown in FIG. 13, a black direction alignment marker 100 that is of the same shape but slightly thinner than the direction alignment marker 80 of the precision confirmation substrate 70 is formed on the precision confirmation chip 90 at a position corresponding to the direction alignment marker 80. X-axis measurement graduations 101 and Y-axis measurement graduations 102 are formed at positions corresponding to the X-axis graduation reference line 83 and Y-axis graduation reference line 84 of the X-axis measurement graduations 81 and Y-axis measurement graduations 82 on the precision confirmation substrate 70.

The X-axis graduation reference line 103 of the X-axis measurement graduations 101 is provided at a position that matches up with the X-axis graduation reference line 83, and the graduation spacing of the X-axis measurement graduations 101 is formed 2 $\mu$m, for instance, smaller than the graduation spacing of the X-axis measurement graduations 81. Likewise, the Y-axis graduation reference line 104 of the Y-axis measurement graduations 102 is provided at a position that matches up with the Y-axis graduation reference line 84, and the graduation spacing of the Y-axis measurement graduations 102 is formed 2 $\mu$m, for example, smaller than the graduation spacing of the Y-axis measurement graduations 82.

The X-axis measurement graduations 101 are provided slightly offset in the Y axial direction so that the position of the X-axis measurement graduations 101 can be made out when they are superimposed with the X-axis measurement graduations 81. Likewise, the Y-axis measurement graduations 102 are provided slightly offset in the X axial direction so that the position of the Y-axis measurement graduations 102 can be made out when they are superimposed with the Y-axis measurement graduations 82.

The bonding method will now be described.

Before the operation, the following items are inputted in the memory component of a control circuit. These items include the number of chips 62 to be bonded to the substrates 41A and 41B, the number of times the positional precision confirmation operation is started, the positions of the tool stations 55 (55A, 55B, 55C), the positions within the trays 63 positioned on the chip placement sites 60, and the positioning positions within the tray 63 positioned on the precision confirmation chip placement site 61. Also included are the standby positions of the precision confirmation substrate positioning component 50 and optical probe 14, as well as image data such as images of the substrates 41A and 41B, an image of the chip 62, an image of the precision confirmation substrate 70, and an image of the precision confirmation chip 90.

The confirmation of precision of bonding positions will now be described.

The precision confirmation substrate 70 is pre-positioned by the positioning pins 51 as shown in FIG. 3 on the precision confirmation substrate positioning component 50 shown in FIG. 1, and is held by suction by the application of a vacuum to the precision confirmation substrate suction groove 52. At this point, the XY table 11 is driven by the XY drive component 10 so that the tool station 55A that holds the tool 30A for confirming precision is positioned directly under the tool mounting component 20. The bonding head 13 is then lowered until the tool mounting component 20 comes into contact with the tool 30A, whereupon a vacuum is applied to the tool suction groove 21 of the tool mounting component 20 shown in FIG. 8, and the tool 30A is held by suction to the tool mounting component 20. After this, the bonding head 13 is raised.

The XY table 11 is then driven so that a precision confirmation chip 90 inside the tray 63 at the precision confirmation chip placement site 61 is positioned directly under the tool 30A held by the tool mounting component 20. The bonding head 13 is then lowered until the tool 30A comes into contact with the precision confirmation chip 90, whereupon a vacuum is applied in the hole 22 in the tool mounting component 20, and the precision confirmation chip 90 is held by suction to the tool 30A. The XY table 11 is then driven so that the precision confirmation substrate 70 that has been positioned by the precision confirmation substrate positioning component 50 is positioned directly under the precision confirmation chip 90 held by suction to the tool 30A.

The optical probe 14 is then moved in the direction of arrow A and thereby inserted between the precision confirmation substrate 70 and the precision confirmation chip 90, and the patterns and pads 73 and 93 of the precision confirmation substrate 70 and precision confirmation chip 90 are detected by the optical probe 14. The XY table 11 is then moved to align the precision confirmation substrate 70 and precision confirmation chip 90. After this, the optical probe 14 is moved and retracted in the direction of arrow B; after which the bonding head 13 is lowered to position the precision confirmation chip 90 over the precision confirmation substrate 70, and the vacuum is turned off from the hole 22 in the tool mounting component 20. As a result, the precision confirmation chip 90 is placed on the precision confirmation substrate 70. The bonding head 13 is then raised.

The optical probe 14 is then moved back over the precision confirmation chip 90 that has been placed on the precision confirmation substrate 70 as described above. Any misalignment between the precision confirmation substrate 70 and the precision confirmation chip 90 is then detected. FIG. 10 shows the precision confirmation chip 90 placed as above on the precision confirmation substrate 70, viewed through the precision confirmation chip 90. As described above, the precision confirmation substrate 70 and the precision confirmation chip 90 are both composed of transparent glass, so the positional precision can be observed.

Thus, the optical probe 14 measures misalignment by way of the X-axis measurement graduations 81 and Y-axis measurement graduations 82 provided on the precision confirmation substrate 70 and further by way of the X-axis measurement graduations 101 and Y-axis measurement graduations 102 provided on the precision confirmation chip 90. In other words, misalignment in the X and Y axial directions can be measured by means of the relations between the X-axis measurement graduations 81 and the X-axis measurement graduations 101 and between the Y-axis measurement graduations 82 and the Y-axis measurement graduations 102. If the X-axis graduation reference line 83 of the X-axis measurement graduations 81 matches up with the X-axis graduation reference line 103 of the X-axis measurement graduations 101, there is no misalignment in the X axial direction. Likewise, if the Y-axis graduation reference line 84 of the Y-axis measurement graduations 82 matches up with the Y-axis graduation reference line 104 of the Y-axis measurement graduations 102, there is no misalignment in the Y axial direction. In this case, if, for example, the spacing of the X-axis measurement graduations 101 is 2 $\mu$m smaller than the spacing of the X-axis measurement graduations 81, the fifth X-axis measurement graduation 101 from the X-axis graduation reference line 103 will have a graduation spacing that is shifted by five X-axis measurement graduations 81 times 2 $\mu$m, or 10 $\mu$m.

If there is misalignment in the X axial direction, the X-axis graduation reference line 83 will not match up with the X-axis graduation reference line 103. The amount of misalignment can be made out by checking where the X-axis measurement graduations 81 and 101 match up. If it is assumed here that the third X-axis measurement graduation 101 matches up with the third graduation to the right of the X-axis graduation reference line 83, and if the spacing of the X-axis measurement graduations 101 is 2 μm smaller than the spacing of the X-axis measurement graduations 81, then the precision confirmation chip 90 is shifted to the right by 6 μm (32 μm) in the X axial direction with respect to the precision confirmation substrate 70. The same applies for misalignment in the Y axial direction.

The above-described measurement of misalignment with the optical probe 14 can be performed by taking an image with a camera that is provided on the optical probe 14, and this image is displayed on a monitor.

Providing the direction alignment marker 80 and the direction alignment marker 100 on the precision confirmation substrate 70 and the precision confirmation chip 90 makes it possible to check whether the alignment directions of the two are matched up. As shown in FIG. 10, the directions of the precision confirmation substrate 70 and the precision confirmation chip 90 match up when the direction alignment marker 100 of the precision confirmation chip 90 is within the direction alignment marker 80 of the precision confirmation substrate 70. If, however, the direction of the precision confirmation chip 90 is not correct, and the precision confirmation chip 90 is rotated 90 degrees to the left, for example, then the direction alignment marker 100 will appear at the lower left, so that the direction alignment marker 100 will not match up with the direction alignment marker 80.

In the above embodiment, the spacing of the X-axis measurement graduations 101 and the Y-axis measurement graduations 102 is formed smaller than the spacing of the X-axis measurement graduations 81 and the Y-axis measurement graduations 82; however, it should go without saying that the spacing can be formed larger instead.

After the positional precision has been confirmed, the optical probe 14 retracts in the direction of arrow B and returns to its original standby position. After this, the bonding head 13 is lowered until the tool 30A comes into contact with the precision confirmation chip 90, a vacuum is applied to the hole 22 in the tool mounting component 20, and the tool 30A holds the precision confirmation chip 90 by suction. The XY table 11 is then driven so that the portion of the tray 63 at the precision confirmation chip placement site 61 that had contained the precision confirmation chip 90 now held by suction to the tool 30A is positioned directly under the tool 30A. The bonding head 13 is then lowered and the precision confirmation chip 90 held by suction to the tool 30A is positioned over the tray 63, whereupon the vacuum is turned off in the hole 22 of the tool mounting component 20 and the precision confirmation chip 90 is put in the tray 63. The bonding head 13 is then raised, and the XY table 11 is driven to return the bonding station 12 to its original position.

As discussed above, if the positional precision of the precision confirmation substrate 70 and the precision confirmation chip 90 as detected by the optical probe 14 is within a specified range, the tool 30A held by suction to the tool mounting component 20 is returned to the tool station 55A; and then the ordinary bonding operation discussed below is carried out. The tool station 55A of the tool 30A held by suction is returned to the tool mounting component 20 in the following manner: the XY table 11 is driven so that the tool station 55A is positioned directly under the tool mounting component 20, after which the bonding head 13 is lowered until the tool 30A held by suction to the bonding head 13 is positioned on the tool station 55A, the vacuum for the tool suction groove 21 of the tool mounting component 20 is turned off so as to put the tool 30A on the tool station 55A, the bonding head 13 is raised, and then the XY table 11 is driven so as to return the bonding station 12 to its original position.

If the positional precision of the precision confirmation substrate 70 and the precision confirmation chip 90 is outside the specified range, then adjustments are made to the mechanism of the optical probe 14, the XY drive component 10 of the XY table 11, and so on. Of these adjustments, the adjustment of the mechanism of the optical probe 5, for instance, is performed because, as disclosed in Japanese Patent Application Publication (Kokoku) H6-28272, the images detected by upper and lower detection components are each captured by an imaging element via separate optical systems; and since there are thus two optical systems, positional discrepancy occurs if the two systems are not aligned; as a result, the optical systems need to be adjusted.

After adjustment, the precision confirmation operation discussed above is once again performed. More specifically, this involves the holding of the tool 30A by suction to the tool mounting component 20, the holding of the precision confirmation chip 90 by suction to the tool 30A, the movement of the precision confirmation substrate 70 from the precision confirmation substrate positioning component 50 to directly under the tool mounting component 20, the detection and correction of any misalignment between the precision confirmation substrate 70 and the precision confirmation chip 90 by means of the optical probe 14, the retraction of the optical probe 14, the placement of the precision confirmation chip 90 on the precision confirmation substrate 70, and the detection by the optical probe 14 of the superimposed precision confirmation substrate 70 and precision confirmation chip 90. After misalignment is detected, the precision confirmation chip 90 is placed in the tray 63 at the precision confirmation chip placement site 61. If the positional precision is within the specified range, the tool 30A is returned to the tool station 55A and the ordinary bonding operation discussed below is carried out.

An ordinary bonding operation will now be discussed.

First, the bonding tool 30B is held by suction to the tool mounting component 20. This operation will not be described here since it is the same as the operation that holds the tool 30A by suction on the tool mounting component 20. The tool mounting component 20 is raised while holding the tool 30B by suction, whereupon the XY table 11 is driven so that a chip 62 in the tray 63 at the chip placement site 60 is positioned directly under the tool 30B. The bonding head 13 is then lowered until the tool 30B comes into contact with the chip 62, whereupon a vacuum is applied to the hole 22 in the tool mounting component 20 and the tool 30B holds the chip 62 by suction. The bonding head 13 is then raised, after which the XY table 11 is driven so that one of the bonding components 42A of the substrate 41A is positioned directly under the tool mounting component 20.

The optical probe 14 is then moved in the direction of arrow A and inserted between the chip 62 and the bonding component 42A used for detection, and the respective patterns and pads of the chip 62 and the bonding component 42A are detected by the optical probe 14. The XY table 11 is then moved so as to level and position the substrate 41A and the chip 62. After this, the optical probe 14 is retracted in the direction of arrow B, after which the bonding head 13 is lowered, the chip 62 is bonded to the bonding component 42A of the substrate 41A, and then the bonding head 13 is raised. Thereafter, this bonding operation is repeated successively for the rest of the bonding components 42A and 42B of the substrates 41A and 41B.

In the above embodiment, the bonding head 13 is movable up and down and also rotatable; and a table provided with the bonding station 12, the tool stations 55 (55A, 55B, 55C), the chip placement sites 60, the precision confirmation chip placement site 61, and so on is the XY table 11. However, the bonding head 13 may instead be provided movably in the X and Y axial directions to the XY table, and the XY table 11 may be a table that is not movable in the X and Y axial directions. Another option is that the bonding head 13 is movable in only the X axial direction, and the XY table 11 is movable only in the Y axial direction, not in the XY directions.

Further, the above description is made with reference to the precision confirmation substrate 70 and the precision confirmation chip 90 formed in a daisy-chain pattern. However, they can also be used for flip-chip bonding precision confirmation with an ordinary pattern that is not a daisy-chain pattern. When actual transparent substrates and chips are produced, the precision confirmation substrate 70 and precision confirmation chip 90 can be applied to semiconductor device finished products composed of the transparent substrates and chips.

Also in the above embodiment, the precision confirmation chip 90 is merely placed on the precision confirmation substrate 70, thus performing a precision detection, but electrical conduction can also be confirmed by bonding the precision confirmation chip 90 to the precision confirmation substrate 70 and by utilizing the electrical conduction precision confirmation terminals 76 of the precision confirmation bonding elements. The injection state can be confirmed through the precision confirmation chip 90 in the sealant injection test conducted after bonding.

As seen from the above, according to the present invention, a precision confirmation substrate composed of a transparent sheet member and a precision confirmation chip composed of a transparent sheet member are used; and the precision confirmation substrate is positioned and fixed to a bonding station, and the precision confirmation chip is held by suction to a tool and disposed above the precision confirmation substrate. The optical probe is inserted between the precision confirmation substrate and the precision confirmation chip so as to detect an image of the precision confirmation substrate and an image of the precision confirmation chip. The precision confirmation substrate and the precision confirmation chip are moved and positioned relative to each other, and the optical probe is retracted from between the precision confirmation substrate and the precision confirmation chip. The precision confirmation chip is then placed on the precision confirmation substrate, and the superimposed precision confirmation substrate and precision confirmation chip are detected by the optical probe. The bonding precision is thus confirmed on a bonding apparatus, and bonding with ensured precision can be performed.

What is claimed is:

1. A flip-chip bonding method in which a chip held by a suction to a tool is disposed over a substrate positioned at a bonding station, an optical probe having upper and lower detection components is inserted between said substrate and said chip so as to detect an image of said substrate and an image of said chip, said substrate and said chip are moved and positioned relative to each others said optical probe is reacted from between said substrate and said chip, and then said chip is bonded to said substrate, wherein said method uses a precision confirmation substrate consisting of a transparent sheet member and a precision confirmation chip consisting of a transparent sheet member and comprises the steps of:
positioning said precision confirmation substrate at said bonding station,
holding said precision confirmation chip by suction to a tool and disposing said cup over said precision confirmation substrate,
insert said optical probe between said precision confirmation substrate and said precision confirmation chip so as to detect an image of said precision confirmation substrate and an image of said precision confirmation chip,
moving and positioning said precision confirmation substrate and said precision confirmation chip relative to each other,
retracting said optical probe from between said precision confirmation substrate and said precision confirmation chip,
placing said precision confirmation chip on said precision confirmation substrate, and
detecting said superimposed precision confirmation substrate and precision confirmation chip by said optical probe,
thereby confirming a precision of bonding positions of a flip-chip bonding apparatus, and
the precision confirmation substrate and the precision confirmation chip are both made from glass.

2. A flip-chip bonding apparatus in which a chip held by a suction to a tool is disposed over a substrate positioned at a bonding station, an optical probe having upper and lower detection components is inserted between said substrate and said chip so as to detect an image of said substrate and an image of said chip, said substrate and said chip are moved and positioned relative to each other, said optical probe is retracted from between said substrate and said chip, and then said chip is bonded to said substrate, wherein said apparatus uses a precision confirmation substrate consisting of a transparent sheet member and a precision confirmation chip consisting of a transparent sheet member, and comprises:
a precision confirmation position provided at which said precision confirmation substrate is positioned at said bonding station, and
a precision confirmation chip placement site provided at which said precision confirmation chip is placed on said bonding station or on a table on which said bonding station is mounted, wherein
said precision confirmation chip is held by suction to a tool and disposed over said precision confirmation substrate,
said optical probe is inserted between said precision confirmation substrate and said precision confirmation chip so as to detect an image of said precision confirmation substrate and an image of said precision confirmation chip, said precision confirmation substrate and said precision confirmation chip are moved and positioned relative to each other, said optical probe is retracted from between said precision confirmation substrate and said precision confirmation chip, said precision confirmation chip is then placed on said precision confirmation substrate, and said superimposed precision confirmation substrate and precision confirmation chip are detected by said optical probe, thereby confirming a precision of bonding positions of said flip-chip bonding apparatus, and the precision confirmation chip and the precision confirmation substrate are both made from glass.

* * * * *